(12) United States Patent
Sim et al.

(10) Patent No.: US 10,629,450 B2
(45) Date of Patent: Apr. 21, 2020

(54) METHOD FOR SELECTIVELY ETCHING SILICON OXIDE FILM

(71) Applicant: TES CO., LTD, Gyeonggi-do (KR)

(72) Inventors: Tae-Yong Sim, Gyeonggi-do (KR); Jong-Bae Lee, Gyeonggi-do (KR)

(73) Assignee: TES CO., LTD, Yongin, Gyeonggi-do (KR)

( * ) Notice: Subject to any disclaimer, the term of this patent is extended or adjusted under 35 U.S.C. 154(b) by 0 days.

(21) Appl. No.: 16/142,335

(22) Filed: Sep. 26, 2018

(65) Prior Publication Data

US 2019/0027374 A1 Jan. 24, 2019

Related U.S. Application Data

(63) Continuation of application No. PCT/KR2017/003305, filed on Mar. 28, 2017.

(30) Foreign Application Priority Data

Apr. 1, 2016 (KR) .................. 10-2016-0040190

(51) Int. Cl.
*H01L 21/311* (2006.01)
*H01L 21/67* (2006.01)
(Continued)

(52) U.S. Cl.
CPC ...... *H01L 21/31116* (2013.01); *H01L 21/022* (2013.01); *H01L 21/0217* (2013.01);
(Continued)

(58) Field of Classification Search
CPC .............. C23F 1/26; H01L 21/02175; H01L 21/02274; H01L 21/0228; H01L 21/0332;
(Continued)

(56) References Cited

U.S. PATENT DOCUMENTS

| 2006/0032833 A1* | 2/2006 | Kawaguchi | H01L 21/0206 216/37 |
| 2010/0093179 A1* | 4/2010 | Hori | H01L 21/02238 438/723 |
| 2016/0265112 A1* | 9/2016 | Tolle | H01L 21/67109 |

FOREIGN PATENT DOCUMENTS

| JP | 2012-164949 A | 8/2012 |
| KR | 10-2003-0026475 A | 4/2003 |

(Continued)

OTHER PUBLICATIONS

International Search Report for International Patent Application No. PCT/KR2017/003305, dated Jul. 5, 2017, 5 pages.
Notification of Reason for Refusal for Korean Patent Application No. 10-2016-0040190, from the Korean Intellectual Property Office, dated Jan. 24, 2018, 9 pages.
Notification of Reason for Refusal for Korean Patent Application No. 10-2016-0040190 from the Korean Intellectual Property Office, dated Jul. 10, 2017, 11 pages.

(Continued)

*Primary Examiner* — Lan Vinh
(74) *Attorney, Agent, or Firm* — Mintz Levin Cohn Ferris Glovsky and Popeo, P.C.; Steven M. Jensen

(57) ABSTRACT

The present invention relates to a method for selectively etching a silicon oxide film in a semiconductor manufacturing process and comprises: a step of introducing a substrate having a silicon nitride film and a silicon oxide film to a substrate support part inside a reactor; a step of heating the substrate introduced into the reactor, so as to maintain a first temperature; a first step of supplying halogen gas and basic gas to the inside of the reactor, while the first temperature is maintained, so as to be reacted with the silicon oxide film formed on the substrate, thereby forming a reaction product on the substrate; a second step of heating the substrate, having the reaction product, up to a second temperature so as to remove the reaction product; a third step of cooling the temperature of the substrate down to the first temperature; and a step of repetitively performing the first step to the third step a preset number of times.

6 Claims, 5 Drawing Sheets

(51) Int. Cl.
*H01L 21/324* (2006.01)
*H01L 21/02* (2006.01)

(52) U.S. Cl.
CPC ...... *H01L 21/02164* (2013.01); *H01L 21/324* (2013.01); *H01L 21/67109* (2013.01); *H01L 21/67115* (2013.01); *H01L 21/67248* (2013.01)

(58) Field of Classification Search
CPC .......... H01L 21/2225; H01L 21/28194; H01L 21/31111; H01L 21/31122; H01L 29/513; H01L 29/517; H01L 21/02164; H01L 21/0217; H01L 21/022; H01L 21/31116; H01L 21/324; H01L 21/67109; H01L 21/67115; H01L 21/67248
USPC ....... 438/706, 700, 710, 712, 714, 715, 717, 438/719, 723, 756, 758, 765
See application file for complete search history.

(56) References Cited

FOREIGN PATENT DOCUMENTS

| | | | |
|---|---|---|---|
| KR | 10-2010-0065875 | A | 6/2010 |
| KR | 10-2010-0105398 | A | 9/2010 |
| TW | 201530650 | A | 8/2015 |
| TW | 201539569 | A | 10/2015 |
| TW | 201541527 | A | 11/2015 |

OTHER PUBLICATIONS

Office Action from Taiwan Intellectual Property Office for Taiwan Patent Application No. 106110238 dated Nov. 6, 2017, English translation, 7 pages.

\* cited by examiner

METHOD FOR SELECTIVELY ETCHING SILICON OXIDE FILM

CROSS-REFERENCE TO RELATED APPLICATIONS

This application is a continuation application of International Application No. PCT/KR2017/003305 filed on Mar. 28, 2017, which claims priority to Korean Application No. 10-2016-0040190 filed on Apr. 1, 2016. The applications are incorporated herein by reference.

TECHNICAL FIELD

The present invention relates to a selective etching method of a silicon oxide film and, more particularly, to a selective etching method of a silicon oxide film, for remarkably enhancing etch uniformity and etch selectivity and improving throughput along with reduction in processing time.

BACKGROUND ART

Recently, along with miniaturization of patterns in a semiconductor manufacturing process, there has been an increase in the number of processes in which an etching amount needs to be precisely controlled while a silicon oxide ($SiO_2$) film is selectively etched.

For example, in a process of manufacturing a NAND flash memory device, an oxide film grown in a device isolation region is etched before an oxide-nitride-oxide (ONO) insulation film and a control gate pattern are formed above a floating gate.

In this case, when an etching amount of the oxide film is not precisely controlled, an exposure degree of a pattern of the floating gate is changed for each device region and, thus, characteristics of devices are not uniform and, when the oxide film is not selectively removed, there is a problem in that an exposed portion of a floating gate electrode is also etched during etching.

To overcome this problem, conventionally, a wet etching method or a plasma etching method is used, but the wet etching method has a difficulty in controlling an etching amount while having a high etch selectivity and is not appropriate to embody a fine pattern due to isotropic etching characteristics, and the plasma etching method is capable of embodying a fine pattern, has a difficulty in selectively removing a thin film due to a low etch selectivity, and has a problem in that charging damage occurs at a lower film due to charged particles.

Accordingly, recently, gas phase etching (GPE) of vaporizing an etchant, etc. that are used in conventional wet etching, injecting the etchant, etc. into a reactor and, then, removing a thin film via chemical reaction has been introduced and applied.

In this case, along with ammonia ($NH_3$) for selectively etching a silicon oxide film, hydrogen fluoride (HF) gas for adjusting etching characteristics has been mainly used.

An apparatus, etc. that separately include a low-temperature chemical processing chamber in which etching is performed via gas phase etching (GPE) among the above the methods and a high-temperature thermal processing chamber that heats, vaporizes, and removes a non-volatile reaction product generated during the etching have been developed. However, there is a problem in that the size of such an apparatus becomes larger due to an increase in the number of processing chambers, a wafer needs to be transferred between the chambers, and a processing time is delayed due to a transferring time.

Accordingly, in accordance with recent trends, there has been a desperate need to develop dry etching for selectively etching a silicon oxide film and realizing control with a uniform etching amount, which is really required along with miniaturization of patterns.

SUMMARY

An object of the present invention devised to solve the problem lies in a selective etching method of a silicon oxide film, in which etching process and a thermal process are repeatedly performed in the same reactor to enhance throughput and to remarkably enhance etch uniformity and etch selectivity.

Another object of the present invention devised to solve the problem lies in a selective etching method of a silicon oxide film, for reducing an operating time of a heating member to increase the lifespan and efficiency of a heating member used in a thermal process.

The object of the present invention can be achieved by providing a selective etching method of a silicon oxide film, the method including transferring a wafer with a silicon nitride film and a silicon oxide film formed thereon, to a wafer support inside a reactor, heating and maintaining the wafer transferred into the reactor at a first temperature, a first operation of supplying halogen gas and basic gas into the reactor and allowing the halogen gas and the basic gas to react with the silicon oxide film formed on the wafer to generate a reaction product on the wafer while the first temperature is maintained, a second operation of heating the wafer with the reaction product generated thereon at a second temperature to remove the reaction product, a third operation of cooling the wafer at the first temperature, and repeatedly performing the first to third operations by a predetermined number of times.

Here, the first temperature may be in the range of 35° C. to 100° C. and the second temperature may be in the range of 110° C. to 250° C.

In this case, the method may further include preheating the wafer immediately before the wafer is transferred into the reactor.

The method may further include mounting the wafer on the wafer support while temperature of the wafer support is maintained at the first temperature in the transferring of the wafer, and preheating the wafer immediately prior to the generating of the reaction product on the wafer.

The method may further include mounting the wafer on the wafer support while temperature of the wafer support is maintained at the first temperature in the transferring of the wafer, and preheating the wafer when the first temperature corresponds to the range of 70° C. to 100° C. after the wafer is transferred into the reactor.

The method may further include cooling the wafer to adjust temperature of the wafer to the first temperature after the preheating of the wafer.

In this case, the cooling of the wafer to adjust the temperature of the wafer to the first temperature may include supplying inert gas into the reactor.

Pressure of the reactor in the heating of the wafer at the second temperature may be equal to or greater than pressure of the reactor in the generating of the reaction product.

Pressure of the reactor in the cooling of the wafer at the first temperature may be equal to or greater than pressure of the reactor in the generating of the reaction product.

In a selective etching method of a silicon oxide film according to the present invention, process and a thermal process may be repeatedly performed in the same reactor, and a temperature difference between etching process temperature and subsequent thermal process temperature may be reduced to reduce a time when the wafer is exposed to high temperature, thereby remarkably enhancing etch uniformity and etch selectivity.

The selective etching method of the silicon oxide film according to the present invention may include preheating a wafer depending on temperature at which an etching process is performed and, thus, etching process temperature may be reached within a short time to reduce a processing time of an etching apparatus, thereby enhancing throughput.

The selective etching method of the silicon oxide film according to the present invention may reduce a temperature difference between the etching process temperature and the subsequent thermal process to reduce an operating time of a heating member, thereby increasing the lifetime and efficiency of the heating member and preventing a yield from being lowered.

DETAILED DESCRIPTION

Reference will now be made in detail to the exemplary embodiments of the present invention, examples of which are illustrated in the accompanying drawings.

Figure 1:
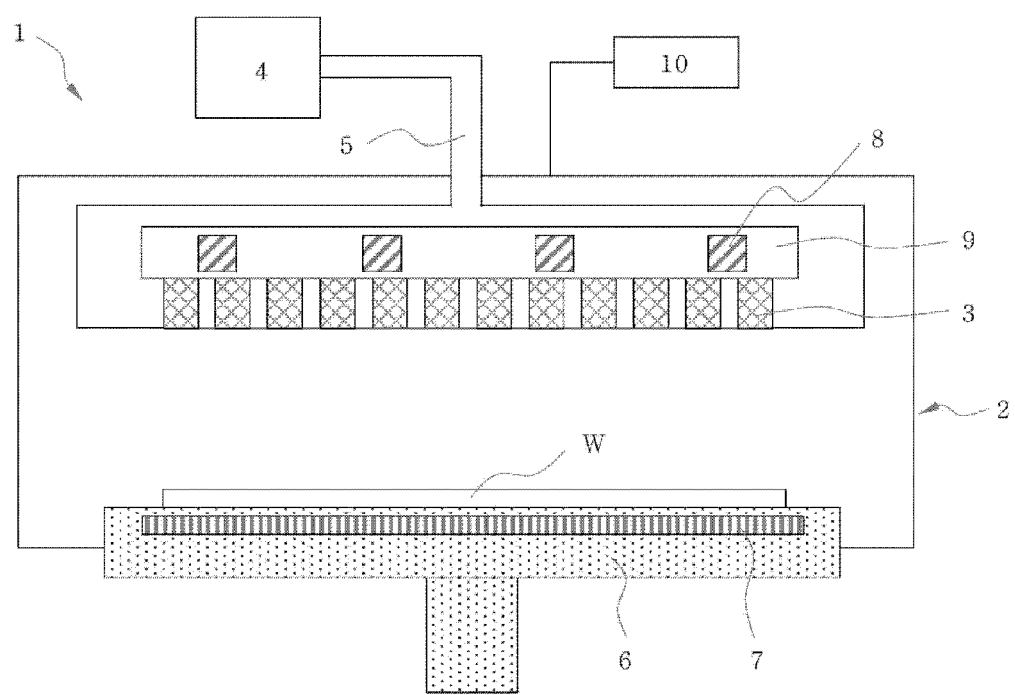
FIG. 1 is a schematic diagram of a silicon oxide film etching apparatus according to the present invention.
Figure 2:
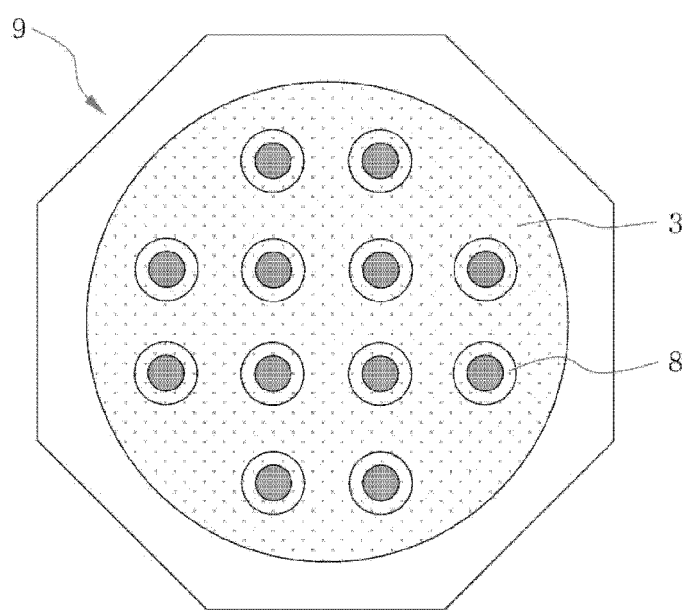
FIG. 2 is a diagram showing a bottom surface of a shower head of the silicon oxide film etching apparatus according to the present invention.

FIG. 1 is a schematic diagram of a silicon oxide film etching apparatus 1 according to the present invention. FIG. 2 is a diagram showing a bottom surface of a shower head 3 of the silicon oxide film etching apparatus 1 according to the present invention.

Referring to FIGS. 1 and 2, the silicon oxide film etching apparatus 1 according to the present invention may include a reactor 2 for providing a processing space in which an etching process, etc. are performed on a wafer W.

The reactor 2 may include a predetermined processing space formed therein and may include a wafer support 6 disposed below the processing space.

The wafer W may be mounted on an upper surface of the wafer support 6. The wafer support 6 may include a temperature holder 7 for heating and maintaining temperature of the wafer W.

The shower head 3 may be disposed above the processing space of the reactor 2 to face the wafer support 6. The shower head 3 may supply process gas fed through a gas supplying line 5 connected to an external gas supplying device 4, toward the wafer W inside the reactor 2.

The etching apparatus 1 according to the present invention may include a heating unit 8 disposed above the wafer support 6 and heating the wafer W. For example, the heating unit 8 may be included in the shower head 3. The heating unit 8 may be separately included from the aforementioned temperature holder 7 and may heat the wafer W. The heating unit 8 may be coupled to a heating member module 9 and may be included in the shower head 3.

In this case, the heating unit 8 may be a high-efficiency radiation heat source such as a heater or a halogen lamp. According to the present invention, the heating unit 8 may use, for example, at least one lamp heater. As illustrated in FIG. 2, the etching apparatus 1 may employ a structure in which 12 lamp heaters are arranged at a constant interval to be modularized, to uniformly heat the wafer W positioned below the shower head 3. However, the aforementioned number and arrangement of the lamp heaters included in the heating unit 8 are merely an example and may be appropriately modified.

The etching apparatus 1 according to the present invention may include a controller 10 that controls a member for an etching process and a thermal process, such as the gas supplying device 4, the temperature holder 7, and the heating unit 8 and performs processes.

Hereinafter, a selective etching process and a thermal process of a silicon oxide film, which are performed through the etching apparatus 1 with the aforementioned structure, are described.

Figure 3:
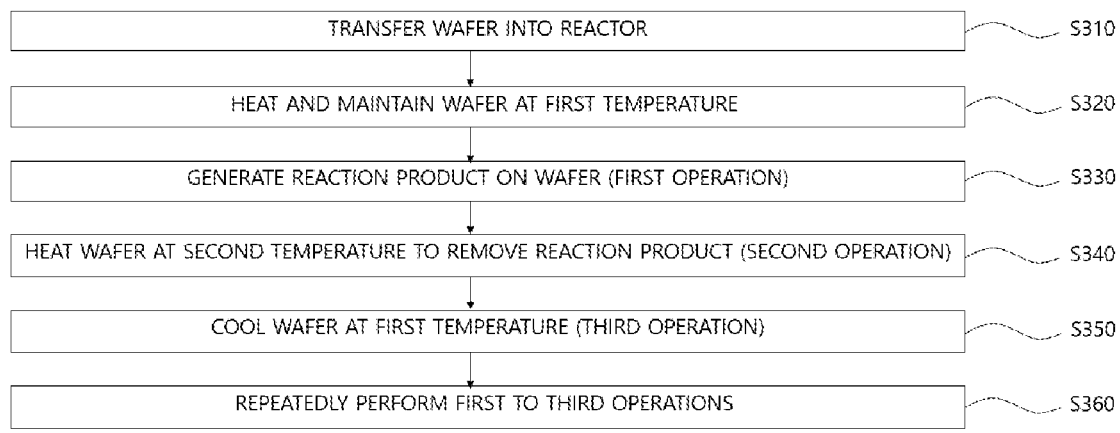
FIG. 3 is a process flowchart showing a selective etching process of a silicon oxide film according to the present invention.

FIG. 3 is a process flowchart showing a selective etching process of a silicon oxide film according to the present invention.

Referring to FIG. 3, the selective etching method of the silicon oxide film according to the present invention may include transferring the wafer W with a silicon nitride film and a silicon oxide film formed thereon, to the wafer support 6 inside the reactor 2 (S310), heating and maintaining the wafer W transferred into the reactor 2 at a first temperature $T_1$ (S320), a first operation of supplying halogen gas and basic gas into the reactor 2 and allowing the halogen gas and the basic gas to react with the silicon oxide film formed on the wafer W to generate a reaction product on the wafer W while the first temperature $T_1$ is maintained (S330), a second operation of heating the wafer W with the reaction product generated thereon at a second temperature $T_2$ to remove the reaction product (S340), a third operation of cooling the wafer W at the first temperature $T_1$ (S350), and repeatedly performing the first to third operations by a predetermined number of times (S360).

First, the wafer W with the silicon nitride film and the silicon oxide film formed thereon may be transferred and mounted on the wafer support 6 inside the reactor 2 (S310).

In this case, the wafer support 6 inside the reactor 2 may be maintained at the first temperature $T_1$ before the wafer W is transferred to the wafer support 6. That is, before the wafer W is mounted on the wafer support 6, the wafer support 6 may be previously maintained at the first temperature $T_1$ for generating the reaction product, which is described below. As such, temperature of the wafer support 6 may be predetermined and, thus, the wafer W may be heated at the first temperature $T_1$ for the generating of the reaction product within a short time period and may be maintained at the first temperature $T_1$.

In this case, temperature of the wafer support 6 may be adjusted by the temperature holder 7 included in the wafer support 6.

Then, the wafer W mounted on the wafer support 6 may be heated and maintained at the first temperature $T_1$ (S320).

In this case, the first temperature $T_1$ for generating of the reaction product, which is a subsequent operation, may be appropriately determined. For example, the first temperature $T_1$ may be appropriately determined depending on film properties or process conditions of a deposited silicon nitride film and silicon oxide film. In the selective etching method according to the present invention, the first temperature $T_1$ may be in the range of 35° C. to 100° C.

In this case, the wafer W transferred into the reactor 2 may be put in a room-temperature state (hereinafter, referred to "initial temperature $T_0$") and the wafer W may be heated and maintained at the first temperature $T_1$. In this case, when a difference between the initial temperature $T_0$ and the first temperature $T_1$ of the wafer W is large, it takes a long time to heat the wafer W at the first temperature $T_1$. In addition, even if the wafer W is transferred into the reactor 2 and is mounted on the wafer support 6 in a state in which the wafer support 6 is maintained at the first temperature $T_1$, it takes a relatively long time to make temperature of the wafer W reach the first temperature $T_1$ and to maintain the wafer W at the first temperature $T_1$. This may act as a factor that reduces throughput of the etching apparatus 1.

Accordingly, the etching method according to the present invention may further include preheating the wafer W at the first temperature $T_1$ to reduce a time taken to heat the wafer W at the first temperature $T_1$.

For example, immediately before the wafer W is transferred into the reactor 2 or immediately before the wafer W is transferred into the reactor 2 to generate the reaction product, the wafer W may be preheated.

As such, when the etching method includes the preheating, if the generating of the reaction product, the heating of the wafer W at the second temperature $T_2$ to remove the reaction product, and cooling the wafer W at the first temperature $T_1$ are repeatedly performed on a predetermined cycle, temperature inside a reactor and temperature of a wafer on a first cycle may be maintained to be the same or similar to temperature inside the reactor and temperature of the wafer on a last cycle. This may mean that an etching environment such as the temperature inside the reactor and the temperature of the wafer is maintained to be the same for each cycle of an etching process. Accordingly, an etching amount for each cycle may be maintained to be almost the same and, thus, may be controllable.

The preheating may be performed immediately before the wafer is transferred into the reactor 2, for example, in a loadlock chamber or a tunnel for connection between the loadlock chamber and the reactor 2. For example, inert gas heated at predetermined temperature may be fed to the loadlock chamber or the tunnel and may be preheated or may be heated by a heating unit included in the loadlock chamber or the tunnel.

The preheating may be performed immediately before the wafer is transferred into the reactor 2 to form the aforementioned reaction product. For example, according to the present embodiment, when the first temperature $T_1$ corresponds to the range of 70° C. to 100° C. immediately before the wafer W is transferred into the reactor 2 to generate the reaction product, the wafer W may be preheated.

In this case, when the temperature holder 7 and the heating unit 8 are simultaneously driven, the wafer W may be preheated. In this case, the temperature holder 7 may be turned on to be continuously driven in the preheating and the heating unit 8 may be set to be turn on for a predetermined time. For example, the heating unit 8 may be set to be driven for about 3 seconds to 60 seconds. The driving time of the heating unit 8 is merely an example and may be appropriately adjusted depending on an etching amount, etching process gas, or the like.

In detail, in the heating and maintaining of the wafer W at the first temperature $T_1$, when the first temperature $T_1$ corresponds to a first range $R_1$ of 35° C. to 70° C., the wafer W may be heated and maintained at predetermined temperature by the temperature holder 7.

When the first temperature $T_1$ corresponds to a second range $R_2$ of 70° C. to 100° C., the etching method may include preheating the wafer prior to the heating and maintaining of the wafer W at the first temperature $T_1$. In this case, the wafer W may be heated using both the temperature holder 7 and the heating unit 8.

That is, when the first temperature $T_1$ corresponds to the first range $R_1$ and a difference between the initial temperature $T_0$ and the first temperature $T_1$ of the wafer W is relatively small, the wafer W may be heated and maintained at predetermined temperature by the temperature holder 7. In this case, this is because a long time is not taken to heat the wafer W even if the wafer W is heated by the temperature holder 7 because the difference between the initial temperature $T_0$ and the first temperature $T_1$ of the wafer W is relatively small.

On the other hand, when the first temperature $T_1$ corresponds to the second range $R_2$ and the difference between the initial temperature $T_0$ and the first temperature $T_1$ of the wafer W is relatively large, the wafer W may be preheated. In this case, the difference between the initial temperature $T_0$ and the first temperature $T_1$ of the wafer W is relatively large and, thus, the wafer W may be preheated using the heating unit 8 as well as the temperature holder 7, thereby reducing a time taken to heat the wafer W.

In the heating and maintaining of the wafer W at the first temperature $T_1$, temperature of the wafer support 6 may be continuously maintained at the first temperature $T_1$. That is, in the heating and maintaining of the wafer W at the first temperature $T_1$, target temperature of the temperature holder 7 included in the wafer support 6 may be set to the first temperature and the temperature holder 7 may be determined to be continuously turned on while the wafer W is transferred into and out of the reactor 2.

As described, when the wafer W is preheated, even if the target temperature or driving time of the heating unit is precisely adjusted, temperature of the wafer W may exceed the first temperature $T_1$. In this case, when the wafer W stands by until the wafer W is cooled at the first temperature $T_1$ over time, a processing time may be increased, thereby degrading throughput.

Accordingly, the etching method may further include cooling the wafer W to adjust temperature of the wafer W to the first temperature $T_1$ after the preheating of the wafer W.

For example, to adjust temperature of the wafer W to the first temperature $T_1$, inert gas such as argon (Ar), helium (He), and nitrogen ($N_2$) may be fed into the reactor 2. When the inert gas is fed, the etching apparatus 1 may include a separate supplying device, but the inert gas may be fed through the gas supplying device 4 and the shower head 3 of the etching apparatus 1. That is, carrier gas that is fed through the gas supplying device 4 and the shower head 3 of the etching apparatus 1 may be fed for cooling. In this case, the inert gas may be fed at pressure of 1 torr to several tens of torr. In this case, when the amount of the inert gas is increased to relatively increase pressure for supplying the inert gas or a throttle valve disposed in the middle of a pump connected to the reactor is adjusted to increase pressure inside the reactor 2, a time when the inert gas remains in the reactor 2 may be increased and heat transfer rate may also be increased, thereby reducing a cooling time.

Accordingly, according to the present invention, the etching method may further include preheating the wafer W and cooling the wafer W after the preheating and, thus, temperature of the wafer W may be adjusted to the first temperature $T_1$ for a relatively short time to reduce a processing time of the etching apparatus 1, thereby enhancing throughput.

The wafer W may be heated and maintained at the first temperature $T_1$ and, then, the first operation of supplying halogen gas and basic gas into the reactor 2 at the first temperature $T_1$ and allowing the halogen gas and the basic gas to react with the silicon oxide film formed on the wafer W to generate a reaction product on the wafer W may be performed (S330).

In this case, process gas may be injected into the reactor 2. According to the present invention, halogen gas and basic gas may be fed as the process gas and, for example, ammonia ($NH_3$) may be used along with hydrogen fluoride (HF). Hydrogen fluoride (HF) is present in a liquid phase at room temperature and, thus, HF may be vaporized by a separate vaporization device and, then, may be fed into the reactor 2 through the gas supplying device 4 and the gas supplying line 5.

In this case, as described above, helium (He), argon (Ar), or nitrogen ($N_2$) gas that is inert gas may be fed along with the process gas, thereby enhancing etch uniformity.

A supply rate of the process gas may be differently set depending on a process target value of a thin film to be etched but, according to the present invention, hydrogen fluoride (HF) may be fed in the range of 10 to 1000 sccm and ammonia ($NH_3$) may be fed in the range of 10 to 1000 sccm in a state in which process pressure inside the reactor 2 is maintained in the range of 0.1 to 20 torr.

Accordingly, the process gas fed into the reactor 2 and the silicon oxide film on the wafer W may chemically react with each other to generate the reaction product on the wafer W.

First, hydrogen fluoride (HF) and ammonia ($NH_3$) may be adsorbed onto a surface of the silicon oxide film and a reaction may proceed according to the following reaction schemes.

In this case, silicon tetrafluoride ($SiF_4$) generated via reaction between a silicon oxide ($SiO_2$) film and hydrogen fluoride (HF) and ammonia ($NH_3$) according to Reaction Scheme 1 or 2 below may re-react with hydrogen fluoride (HF) and ammonia ($NH_3$) to generate ammonium hexafluorosilicate (($NH_4$)$_2$$SiF_6$) according to Reaction Scheme 3 below.

$$SiO_2 + 4HF \rightarrow SiF_4 + 2H_2O \quad \text{[Reaction Scheme 1]}$$

$$SiO_2 + 4HF + 4NH_3 \rightarrow SiF_4 + 2H_2O + 4NH_3 \quad \text{[Reaction Scheme 2]}$$

$$SiF_4 + 2HF + 2NH_3 \rightarrow (NH_4)_2SiF_6 \quad \text{[Reaction Scheme 3]}$$

When the aforementioned operations are completed, the silicon oxide film on the wafer W may react with the process gas to generate the ammonium hexafluorosilicate (($NH_4$)$_2$$SiF_6$) as a reaction product. Accordingly, when the ammonium hexafluorosilicate (($NH_4$)$_2$$SiF_6$) as the reaction product is removed in a subsequent process, the silicon oxide film formed on the wafer W may be removed.

As a result, a process of discharging the ammonium hexafluorosilicate (($NH_4$)$_2$$SiF_6$) inside the reactor may be required. In this case, the ammonium hexafluorosilicate (($NH_4$)$_2$$SiF_6$) is a non-volatile material and is vaporized at high temperature of about 100° C. and, thus, a process of heating and discharging an internal portion of the reactor may be required.

According to some prior arts, to vaporize the non-volatile reaction product and easily discharge the non-volatile reaction product out of the reactor, a technology of largely lowering pressure inside the reactor is applied.

However, according to the above prior art, it takes a significantly long time to increase and reduce the pressure inside the reactor and, in particular, when a process of generating a reaction product and a thermal process are repeatedly performed, a time taken to adjust pressure is further increased and, thus, there is a problem in that an overall processing time is excessively increased.

Accordingly, according to most prior arts, the reaction product is generated at temperature close to room temperature using a method of adjusting temperature inside the reactor and, then, the temperature inside the reactor is increased.

In this case, when temperature at which the reaction product is generated is increased to temperature for a thermal process to remove the reaction product, several tens of seconds to several minutes are taken depending on a temperature difference and, thus, a wafer is continuously exposed to high temperature while the temperature is increased.

As such, according to the prior art, because a difference between the first temperature and the second temperature is large, a time taken to increase and lower temperature is increased to increase an entire processing time and, thus, there is a problem in terms of degraded throughput.

In particular, according to the heating characteristics of the radiation heat source such as the heater or the lamp, temperature has a similar increasing tendency to an exponential function and, thus, has a tendency in which an increasing degree of temperature is low at an initial heating stage and temperature remarkably increases when a predetermined time elapses.

As a result, as heating time is increased, an internal portion of the reactor remarkably becomes in a high-temperature state and a time when the wafer is exposed to high temperature is also increased and, thus, the heating time needs to be reduced to stably control temperature and to increase the lifespan and efficiency of a lamp.

Accordingly, according to the present invention, the selective etching method of the silicon oxide film may reduce a difference between the first temperature and the second temperature or may largely reduce a time taken to increase and reduce temperature via the preheating or the cooling and, accordingly, a time when a wafer is exposed to high temperature is remarkably reduced.

In the selective etching method according to the present invention, a heating time of the wafer is reduced and, thus, failure of etch uniformity and reduction in etch selectivity of a silicon oxide film due to high temperature may be prevented and a processing time may be reduced to enhance throughput, thereby increasing the lifespan and efficiency of a lamp.

As described above, to remove the non-volatile reaction product, the second temperature $T_2$ may be in the range of about 110° C. to 250° C.

In this case, when the wafer W is heated at the second temperature $T_2$, the wafer W may be heated using both the temperature holder 7 and the heating unit 8 (S340). As such, when the wafer W is heated at the second temperature $T_2$ using both the temperature holder 7 and the heating unit 8, the temperature inside the reactor 2 may be in the range of about 100° C. to 200° C.

According to the present invention, a difference between the first and second temperatures is relatively small compared with the prior art, but both the temperature holder 7 and the heating unit 8 may be used to reduce a time taken to heat the wafer W at the second temperature $T_2$. Accordingly, a time taken to increase temperature of the wafer W may be reduced to reduce a processing time and to enhance throughput.

For example, when the first temperature $T_1$ is set to 90° C. and the reaction product is generated and, then, the second temperature $T_2$ is increased to 120° C., a time taken to increase temperature may be reduced to 10 seconds or less.

When the first temperature $T_1$ is increased to 90° C., an effect of heating a wafer may also be achieved while a process of generating the reaction product is performed. Accordingly, the non-volatile reaction product is also partially vaporized while the reaction product is generated and, thus, an etching process may be smoothly performed and removing efficiency of the reaction product in a subsequent thermal process may also be further enhanced.

As the removing efficiency of the reaction product is increased, a thermal processing time may be reduced and, as a result, a time taken to expose a wafer to high temperature may be advantageously and further reduced.

When the wafer W is heated at the second temperature, the temperature holder 7 may be continuously turned on and the heating unit 8 may be set to be turned on for a predetermined time. In this case, the target temperature of the temperature holder 7 may be continuously set to the first temperature $T_1$.

The heating unit 8 may be determined to be turned on for a predetermined time while the wafer W is heated at the second temperature $T_2$. For example, the heating unit 8 may be determined to be driven for about 3 seconds to 60 seconds. Such a driving time of the heating unit 8 is merely an example and, thus, may be appropriately adjusted depending on an etching amount, etching process gas, and so on.

Pressure of the reactor at which the wafer W is heated at the second temperature $T_2$ may be set to be equal to or greater than pressure of the reactor at which the reaction product is generated. In this case, a time when the process gases are not immediately discharged and, instead, remain in the reactor 2 may be relatively lengthened to increase an etching amount. Accordingly, a time of an etching operation of an entire cycle may be reduced to lower a processing time of the entire cycle.

In the case of the aforementioned thermal process, a pumping step using an external vacuum system may also be performed to discharge a reaction product vaporized in the reactor 2.

When the aforementioned thermal process of heating the wafer W at the second temperature to remove the reaction product is completed, some operations may be repeatedly performed and an etching process and a thermal process may be performed as a cyclic process.

In this case, the third step of cooling the wafer W at the first temperature $T_1$ (S350) may be required.

When the thermal process of heating the wafer W at the second temperature $T_2$ to remove the reaction product is completed, the temperature of the wafer W may correspond to the second temperature $T_2$. In this case, when the wafer W stands by until the wafer W is cooled at the first temperature $T_1$ over time, a processing time may be increased, thereby degrading throughput.

Accordingly, the etching method may further include cooling the wafer W to adjust temperature of the wafer W to the first temperature $T_1$. In this case, as described above, inert gas such as argon (Ar), helium (He), and nitrogen ($N_2$) may be fed into the reactor 2. The inert gas may be fed to cool carrier gas through the gas supplying device 4 and the shower head 3 of the etching apparatus 1. In this case, the inert gas may be fed at pressure of 1 torr to several tens of torr.

Pressure of the reactor at which the wafer W is cooled at the first temperature $T_1$ may be set to be equal to or greater than pressure of the reactor at which the silicon oxide film is etched. This is because a large amount of the aforementioned carrier gas remains in the reactor 2 to reduce a cooling time when relatively high pressure is maintained during the cooling.

The first operation of cooling the wafer W at the first temperature $T_1$ and, then, generating the reaction product (S330), the second operation of heating the wafer W at the second temperature $T_2$ (S340), and the third operation of cooling the wafer W at the first temperature $T_1$ (S350) may be repeatedly performed (S360).

During the cyclic process, the first operation of generating the reaction product (S330), the second operation of heating the wafer W at the second temperature $T_2$ (S340), and the third operation of cooling the wafer W at the first temperature $T_1$ have been described above and, thus, a repeated description is omitted herein.

Accordingly, according to the present invention, prior to the cyclic process, the wafer W heated at the second temperature $T_2$ may be cooled at the first temperature $T_1$ for a short time via the cooling to reduce a processing time of the etching apparatus 1, thereby enhancing throughput.

The reaction product may be prevented from being excessively generated on a wafer surface and an internal wall of the reactor through the cyclic process to increase an etching amount of the silicon oxide film and etch selectivity of the silicon oxide film to the silicon nitride film and to also enhance etch uniformity.

Then, when an entire etching process of the silicon oxide film is completed, the wafer W may be discharged out of the reactor 2 and the entire process may be completed.

Hereinafter, an evaluation result for setting an optimum process condition with respect to the aforementioned selective etching method of the silicon oxide film according to the present invention is described.

Figure 4:
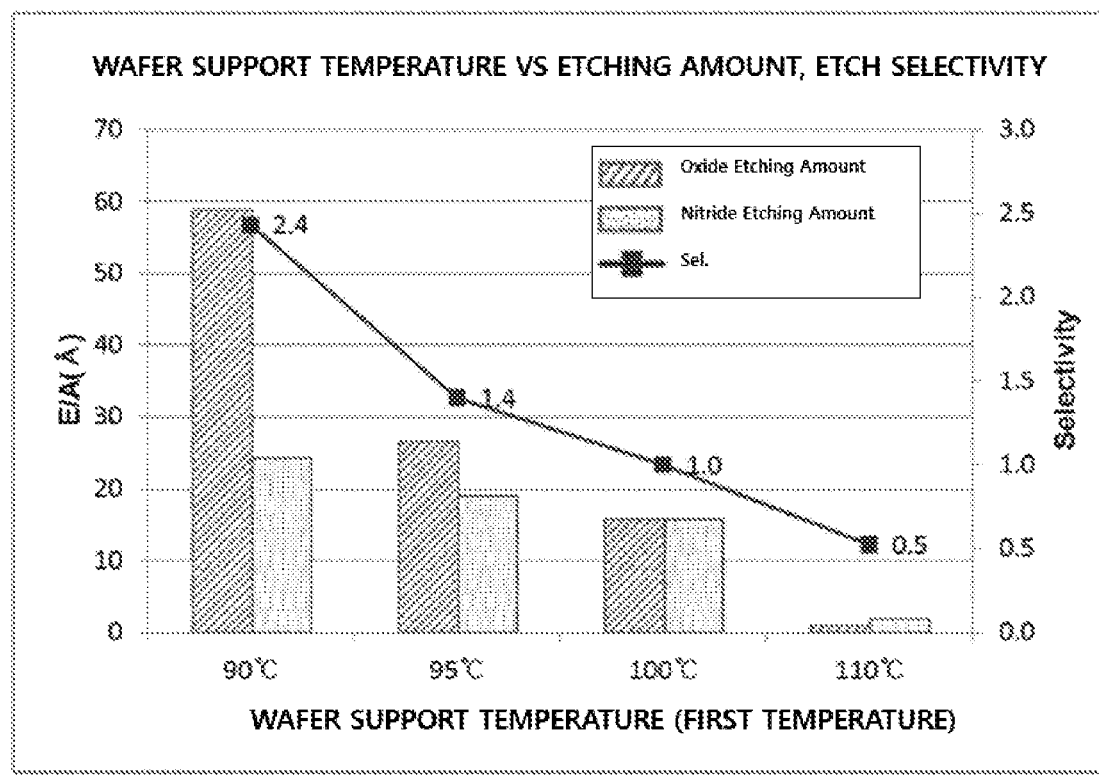
FIG. 4 is a graph showing an etching amount and etch selectivity depending on temperature of a wafer support in a selective etching method of a silicon oxide film according to the present invention.

FIG. 4 is a graph showing an etching amount and etch selectivity depending on temperature of the wafer support 6 in a selective etching method of a silicon oxide film according to the present invention. The graph is for relative comparison and is obtained via a single step but not the aforementioned cyclic process.

Referring to the drawing, when the aforementioned first temperature $T_1$ is 90° C., the etch selectivity is a level of 2.4:1, which is a similar level to the prior art. Accordingly, it may be seen that etching performance is not degraded even when the first temperature $T_1$ is set to 90° C.

However, it may be seen that, as the first temperature $T_1$ is increased to 100° C. or greater, an etching amount and etch selectivity of the silicon oxide film are lowered due to a high-temperature effect.

Figure 5:
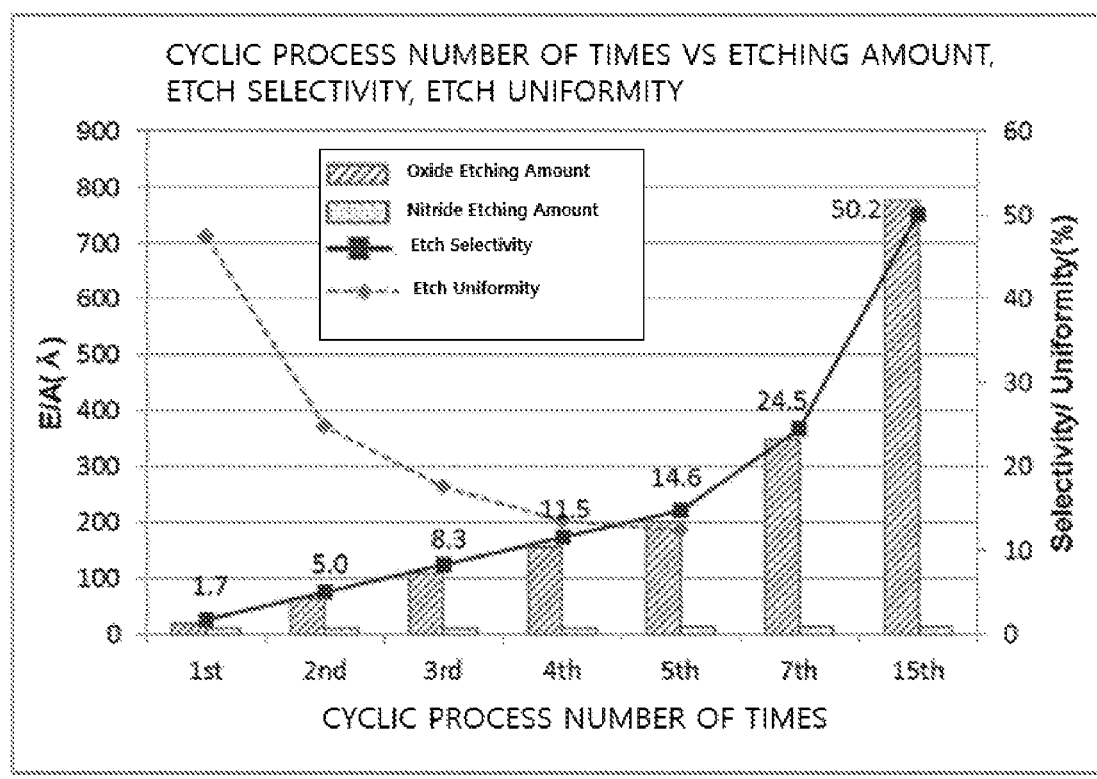
FIG. 5 is a graph of an etching amount, etch selectivity, and etch uniformity depending on a cyclic process number of times in a selective etching method of a silicon oxide film according to the present invention.

FIG. 5 is a graph of an etching amount, etch selectivity, and etch uniformity depending on a cyclic process number of times in a selective etching method of a silicon oxide film according to the present invention.

As seen from the drawing, as a cyclic process number of times is increased, etch selectivity of a silicon oxide film to a silicon nitride film is linearly increased and the cyclic process is performed 15 times and, in this case, the etch selectivity may be remarkably enhanced to a level of about 50:1.

In addition, it may be seen that the etch uniformity is also remarkably enhanced along with increase in etch selectivity.

It may be seen that etching performance is remarkably enhanced compared with the aforementioned result obtained when the single step of FIG. 4 is performed. That is, when the cyclic process is applied to repeatedly remove the reaction product, etching may be prevented from being interrupted and, in this case, the reason for this is analyzed to be based on that an etching amount of the silicon oxide film is continuously increased.

As such, when the first temperature $T_1$ is increased compared with the prior art by the temperature holder 7 to reduce an operating time of the heating unit 8 using the selective etching method of the silicon oxide film according to the present invention, a time taken to expose a wafer to high temperature is reduced and, thus, the etch uniformity and etch selectivity of the silicon oxide film may be remarkably enhanced.

A heating time taken to increase temperature of the wafer to a high temperature condition appropriate for vaporization of the reaction product is reduced and, thus, the lifespan and efficiency of the heating unit 8 may be remarkably increased.

In addition, the etch uniformity in the wafer is enhanced and, thus, when an etching amount of a single step may be lowered and a repetition number of times of the cyclic process is increased, etch selectivity may be further increased and an etching amount of a silicon oxide film may be precisely controlled, thereby remarkably enhancing process controlling performance and process reproducibility.

The selective etching method of the silicon oxide film according to the present invention may be applicable to a semiconductor manufacturing process and other processes of manufacturing a miniaturized apparatus and, in particular, may be used in a process related to enhancement in etch selectivity of a silicon oxide film and a silicon nitride film.

While the present invention has been shown and described in connection with the preferred embodiments, it will be apparent to those skilled in the art that modifications and variations can be made without departing from the spirit and scope of the invention as defined by the appended claims.

In a selective etching method of a silicon oxide film according to the present invention, an etching process and a thermal process are repeatedly performed in the same reactor and, in this case, a temperature difference between etching process temperature and a subsequent thermal process may be lowered and, thus, a time taken to expose a wafer to high temperature may be reduced, thereby remarkably enhancing etch uniformity and etch selectivity.

The selective etching method of the silicon oxide film according to the present invention may include preheating the wafer at temperature at which an etching process is performed and, thus, etching process temperature may be reached within a short time to reduce a processing time of an etching apparatus, thereby enhancing throughput.

The selective etching method of the silicon oxide film according to the present invention may reduce a temperature difference between the etching process temperature and the subsequent thermal process to reduce an operating time of a heating member, thereby increasing the lifetime and efficiency of the heating member and preventing a yield from being lowered.

The invention claimed is:

1. A selective etching method of a silicon oxide film, the method comprising:
   transferring a wafer with a silicon nitride film and a silicon oxide film formed thereon, to a wafer support inside a reactor;
   heating and maintaining the wafer transferred into the reactor at a first temperature;
   a first operation of supplying halogen gas and basic gas into the reactor and allowing the halogen gas and the basic gas to react with the silicon oxide film formed on the wafer to generate a reaction product on the wafer while the first temperature is maintained;
   a second operation of heating the wafer with the reaction product generated thereon at a second temperature by a heating unit disposed above the wafer support to remove the reaction product;
   a third operation of cooling the wafer at the first temperature; and
   repeatedly performing the first to third operations,
   wherein the wafer is preheated before the wafer is transferred into the reactor.

2. The method of claim 1, wherein the first temperature is in the range of 35° C. to 100° C. and the second temperature is in the range of 110° C. to 250° C.

3. The method of claim 1, further comprising cooling the wafer to adjust temperature of the wafer to the first temperature after the preheating of the wafer.

4. The method of claim 1, wherein the cooling of the wafer to adjust the temperature of the wafer to the first temperature includes supplying inert gas into the reactor.

5. The method of claim 1, wherein pressure of the reactor in the heating of the wafer at the second temperature is equal to or greater than pressure of the reactor in the generating of the reaction product.

6. The method of claim 1, wherein pressure of the cooling of the wafer at the first temperature is equal to or greater than pressure of the generating of the reaction product.

* * * * *